United States Patent
Chen et al.

(10) Patent No.: US 9,236,322 B2
(45) Date of Patent: Jan. 12, 2016

(54) METHODS AND APPARATUS FOR HEAT SPREADER ON SILICON

(75) Inventors: Hsien-Wei Chen, Hsin-Chu (TW); Chung-Ying Yang, Taoyuan (TW); Chao-Wen Shih, Zhubei (TW); Kai-Chiang Wu, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 158 days.

(21) Appl. No.: 13/444,558

(22) Filed: Apr. 11, 2012

(65) Prior Publication Data

US 2013/0270686 A1  Oct. 17, 2013

(51) Int. Cl.
*H01L 23/34* (2006.01)
*H01L 23/367* (2006.01)

(52) U.S. Cl.
CPC ......... *H01L 23/367* (2013.01); *H01L 2224/131* (2013.01); *H01L 2224/16237* (2013.01); *H01L 2224/81191* (2013.01); *H01L 2224/81424* (2013.01)

(58) Field of Classification Search
CPC ........... H01L 2224/48227; H01L 2224/32225; H01L 2924/00; H01L 2224/73265; H01L 2924/00012; H01L 2924/15311
USPC ...................................................... 257/777
See application file for complete search history.

(56) References Cited

U.S. PATENT DOCUMENTS

| 2007/0210378 A1 | 9/2007 | Shiraishi |
| 2011/0063806 A1* | 3/2011 | Kariya et al. ................. 361/748 |
| 2011/0140286 A1* | 6/2011 | Machida ....................... 257/777 |
| 2011/0155433 A1* | 6/2011 | Funaya et al. ................ 174/258 |
| 2012/0020028 A1* | 1/2012 | Bachman et al. ............. 361/719 |

FOREIGN PATENT DOCUMENTS

| TW | 200830493 | 12/1996 |
| TW | M375291 | 3/2010 |

* cited by examiner

*Primary Examiner* — David Vu
*Assistant Examiner* — Jonathan Han
(74) *Attorney, Agent, or Firm* — Slater & Matsil, L.L.P.

(57) ABSTRACT

Apparatus and methods for forming a heat spreader on a substrate to release heat for a semi-conductor package are disclosed. The apparatus comprises a substrate. A dielectric layer is formed next to the substrate and in contact with a surface of the substrate. A heat spreader is formed next to the substrate and in contact with another surface of the substrate. A passivation layer is formed next to the dielectric layer. A connection pad is placed on top of the passivation layer. The substrate may comprise additional through-silicon-vias. The contact surface between the substrate and the heat spreader may be a scraggy surface. The packaging method further proceeds to connect a chip to the connection pad by way of a connection device such as a solder ball or a bump.

20 Claims, 6 Drawing Sheets

METHODS AND APPARATUS FOR HEAT SPREADER ON SILICON

BACKGROUND

Since the invention of the integrated circuit (IC), the semiconductor industry has experienced rapid growth due to continuous improvements in the integration density of a variety of electronic components. For the most part, this improvement in integration density has come from repeated reductions in minimum feature size, which allows more components to be integrated into a given area. As the demand for even smaller electronic devices has grown, there has grown a need for smaller and more creative packaging techniques of semiconductor dies.

The current trend of high integration density of electronics also makes electronic devices with smaller components operating at higher clock frequencies and power levels generating more and more heat. These components include electronic packages such as microprocessor and memory packages. The electronic packages typically include a die that is usually mounted onto a supporting substrate sometimes referred to as a carrier or package substrate ("substrate"). The electronic package, in turn, is typically physically and electrically coupled to a printed circuit board (PCB). The die and the substrate are typically made of multiple ceramic or silicon layers. The heat generated by such electronic packages can increase to high levels. One common approach to draw the heat away from the die includes the use of a heat spreader as a lid in thermal contact with the die.

Traditionally, the heat spreader is added after assembly process on the backside of the chip. The process is complicated and thermal performance is not improved sufficiently. The heat spreader may be too thick which results in high stress.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments of the present disclosure are discussed in details below. It should be appreciated, however, that the embodiments of the present disclosure provide many applicable concepts that can be embodied in a wide variety of specific contexts. The specific embodiments discussed are merely illustrative of specific ways to make and use the disclosure, and do not limit the scope of the disclosure.

Current electronic products with high I/O count, high performance, and high density have elevated the heat spread issue for chips and packages. In the disclosed embodiments, the heat spreader is added directly in contact with the package substrate before bumping process and die saw. The advantages of the embodiments include reduced overall package stress, simplified process, and improved heat spreader's thermal performance.

Figure 1:
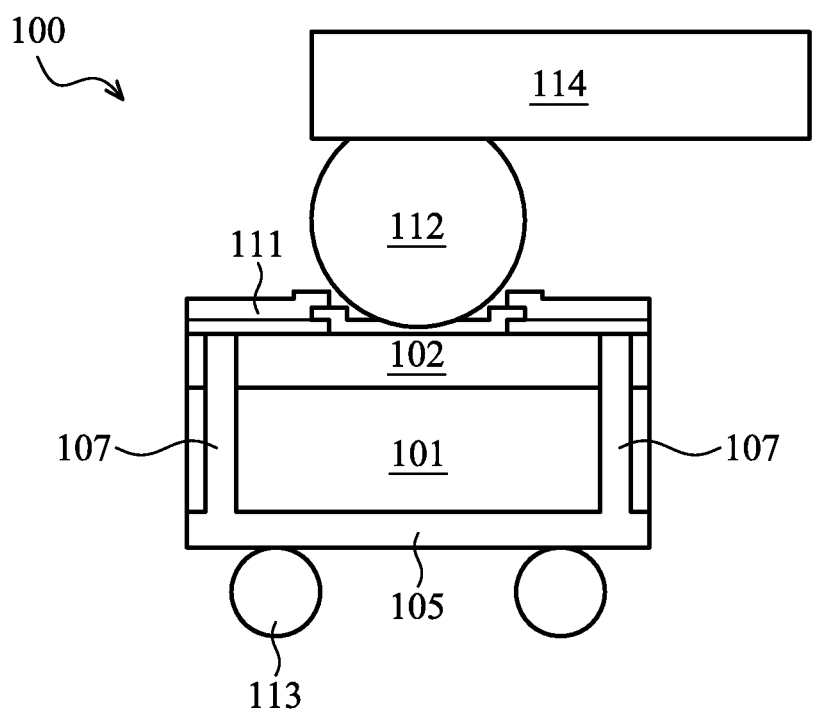
FIG. 1 illustrates a heat spreader structure in a semi-conductor package in accordance with an example embodiment.

FIG. 1 illustrates an example structure according to an embodiment for releasing heat for a semi-conductor package. FIG. 1 is a schematic, cross-sectional diagram illustrating a package in accordance with an embodiment. The structure 100 comprises a substrate 101. A dielectric layer 102 is next to the substrate 101 and in contact with a first surface of the substrate 101. A heat spreader layer 105 is next to the substrate and in contact with a second surface of the substrate 101 opposite to the first surface. The heat spreader layer 105 may be simply referred as the heat spreader as well. A passivation layer 111 is next to the dielectric layer 102. A connection pad 103 is on top of the passivation layer 111.

The connection pad 103 may be an Al pad, or a pad made of some other kind of conductive materials. The heat spreader layer 105 may comprise Ni, Cu, or similar materials, which may be coated on the surface of the substrate 101.

The passivation layer 111 has an opening where the connection pad 103 is located. There may be multiple openings on the passivation layer 111 where multiple respective connection pads 103 may be located. A chip 114 is connected to the connection pad 103 by way of a connection device 112, which may be a solder ball or a bump. Furthermore, a plurality of connection devices 113 such as solder balls may be in contact with the heat spreader layer 105 and used to connect to a PCB, which is not shown.

The substrate 101 may comprise multiple sub-layers. The substrate 101 may further comprise a plurality of through-silicon-via (TSV) 107. Furthermore, not shown in FIG. 1, the substrate 101 may have a scraggy surface in contact with the heat spreader layer 105, to increase the adhesion between the heat spreader layer 105 and the substrate 101. The scraggy surface between the heat spreader layer 105 and the substrate 101 may comprise a plurality of scraggy notches, where a notch may have a height and a width ratio in a range of about 0.4 to 50. For example, the notch of the scraggy surface may have a width of about 10 um to 50 um and a height of about 20 um to 500 um.

Figure 2A:
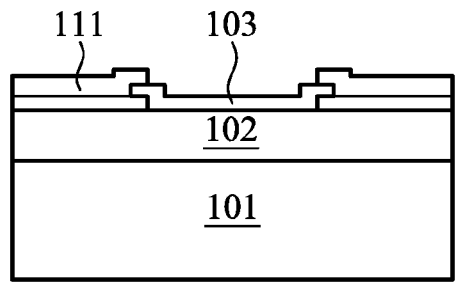
FIGS. 2(a)-2(d) illustrate an example method and apparatus for a heat spreader on a substrate in accordance with an embodiment.

FIGS. 2(a)-2(d) illustrate an example method for forming a heat spreader on a substrate in accordance with an embodiment. FIG. 2(a) shows that a dielectric layer 102 is formed on top of a substrate 101. The substrate 101 may comprise multiple sub-layers. A passivation layer 111 is further formed on top of the dielectric layer 102. An opening or a plurality of openings may be formed on the passivation layer 111. A connection pad 103 may be placed at the opening in the passivation layer 111. There may be a plurality of connection pads 103 located in the respective openings in the passivation layer 111. Only one such connection pad 103 is shown. The connection pad 103 may comprise conductive materials such as Al.

Figure 2C:
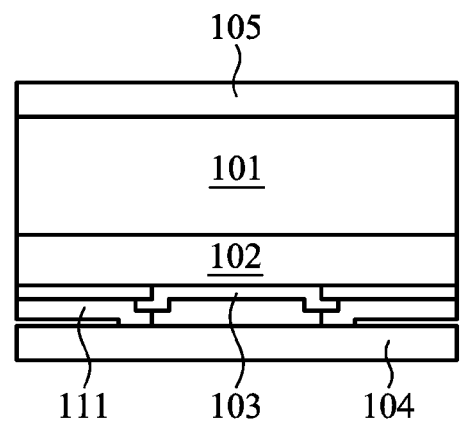
Figure 2B:
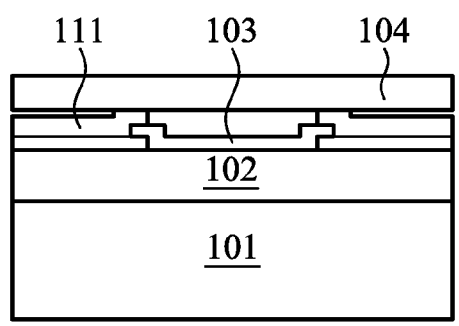
Figure 2D:
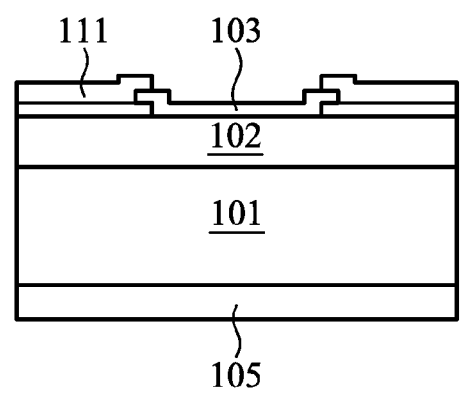

Shown in FIG. 2(b), a protection film 104 is formed on top of the passivation layer 111 and the connection pad 103. The substrate structure is then flipped as shown in FIG. 2(c), where a heat spreader layer 105 may be formed in contact with a surface of the substrate layer 101. The heat spreader layer 105 may comprise Ni, Cu, or other similar materials, which are coated onto the surface of the substrate 101. The substrate structure is then flipped again as shown in FIG. 2(d), where the heat spreader 105 may be at the bottom of the substrate 101, and the protection film 104 becomes the top. Next, the protection film 104 may be removed as shown in FIG. 2(d).

The method for forming a heat spreader on a substrate is part of an overall packaging method. The packaging method may further proceed to connect a chip to the connection pad 103 by way of a connection device such as a solder ball or a bump, which are not shown in FIGS. 2(a)-2(d). The packaging method may also proceed to connect a plurality of connection devices under the heat spreader, and connecting a print circuit board to the plurality of connection devices.

Figure 3A:
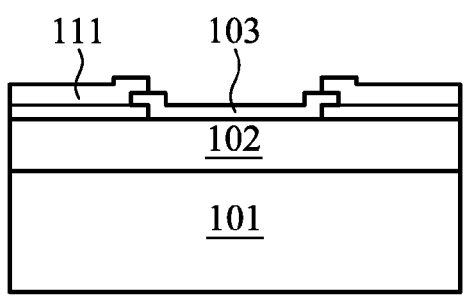
FIGS. 3(a)-3(i) illustrate another example method and apparatus for a heat spreader on a substrate in accordance with an embodiment.

FIGS. 3(a)-3(i) illustrate an example method for forming a heat spreader on a substrate in accordance with an embodiment. FIG. 3(a) shows that a dielectric layer 102 is formed on top of a substrate 101. The substrate 101 may comprise multiple sub-layers. A passivation layer 111 is further formed on top of the dielectric layer 102. An opening or a plurality of openings may be formed on the passivation layer 111. A connection pad 103 may be placed at the opening in the passivation layer 111. There may be a plurality of connection pads 103 located in the respective openings in the passivation layer. Only one such connection pad 103 is shown. The connection pad 103 may comprise conductive materials such as Al.

Figure 3B:
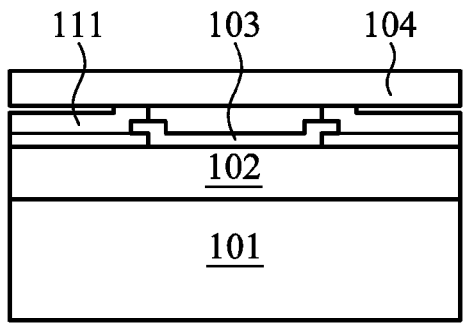
Figure 3C:
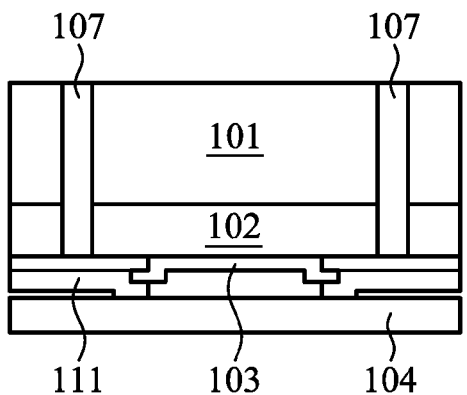

Illustrated in FIG. 3(b), a protection film 104 is formed on top of the passivation layer 111 and the connection pad 103. The substrate structure is then flipped as shown in FIG. 3(c), where a plurality of TSV 107 may be formed through the substrate layer 101 and the dielectric layer 102. The number of TSV 107, the size, and locations are only for illustration purposes and are not limiting. The TSV 107 shown in FIG. 3(c) reaches to the inside of the dielectric layer 102 when the height of the TSV 107 is larger than the height of the substrate. As another example, as shown in FIG. 3(f), the TSV 107 may stop at the interface between the substrate layer 101 and the dielectric layer 102 when the height of the TSV 107 is equal to the height of the substrate. As another example, as shown in FIG. 3(g), the TSV 107 may stop within the substrate layer 101, at a height h2 larger than or equal to about half of the height of the substrate layer 101 h1.

Figure 3D:
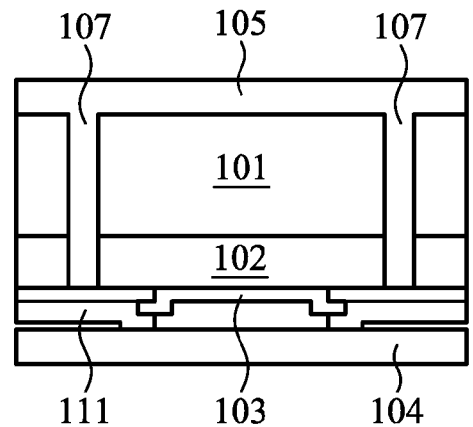
Figure 3E:
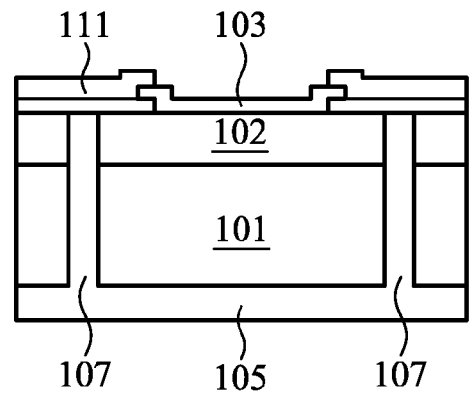
Figure 3F:
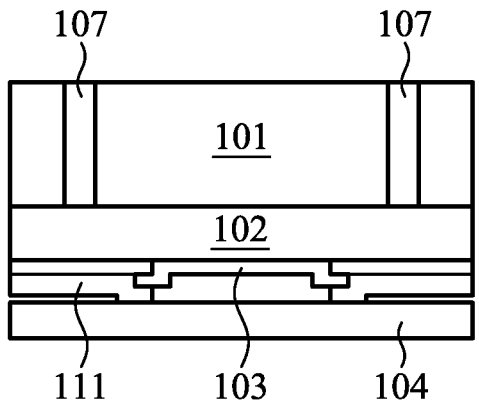
Figure 3H:
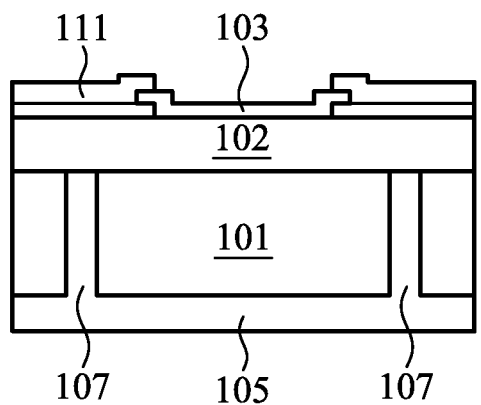
Figure 3G:
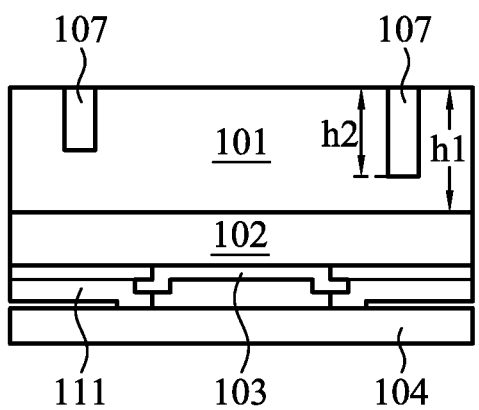
Figure 3I:
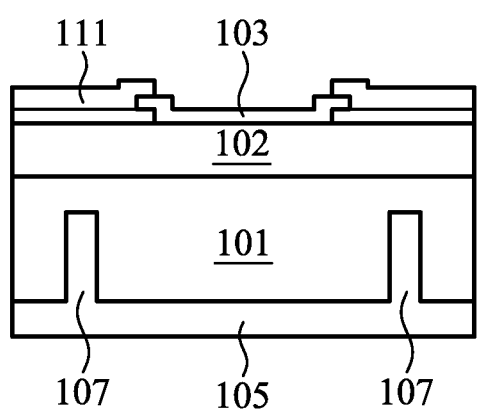

Illustrated in FIG. 3(d), a heat spreader layer 105 may be formed in contact with a surface of the substrate layer 101 and the TSV 107. The heat spreader layer 105 may comprise Ni, Cu, or other similar materials, which may be coated onto the surface of the substrate 101. The substrate structure is then flipped again as shown in FIG. 3(e), where the heat spreader layer 105 may be at the bottom of the substrate 101, and the protection film 104 becomes the top. Next, the protection film 104 may be removed as shown in FIG. 3(e). The heat spreader layer 105 may be formed on the similar structures shown in FIGS. 3(f) and 3(g), in contact with a surface of the substrate layer 101 and the TSV 107. The results with the heat spreader attached are shown in FIGS. 3(h) and 3(i), respectively.

The method for forming a heat spreader on a substrate is part of an overall packaging method. The packaging method may further proceed to connect a chip to the connection pad 103 by way of a connection device such as a solder ball or a bump, which is not shown in FIGS. 3(a)-3(e). The packaging method may also proceed to connect a plurality of connection devices under the heat spreader, and connecting a print circuit board to the plurality of connection devices.

Figure 4A:
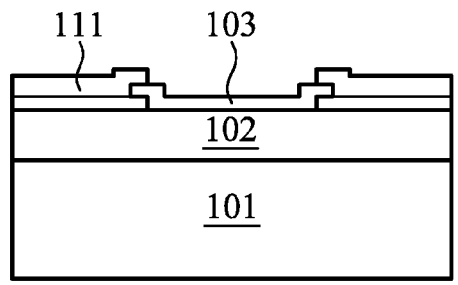
FIGS. 4(a)-4(g) illustrate yet another example method and apparatus for a heat spreader on a substrate in accordance with an embodiment.

FIGS. 4(a)-4(g) illustrate yet an example method and apparatus for forming a heat spreader on a substrate in accordance with an embodiment. FIG. 4(a) shows that a dielectric layer 102 is formed on top of a substrate 101. The substrate 101 may comprise multiple sub-layers. A passivation layer 111 is further formed on top of the dielectric layer 102. An opening or a plurality of openings may be formed on the passivation layer 111. A connection pad 103 may be placed at the opening in the passivation layer 111. There may be a plurality of connection pads 103 located in the respective openings in the passivation layer 111. Only one such connection pad 103 is shown. The connection pad 103 may comprise conductive materials such as Al.

Figure 4B:
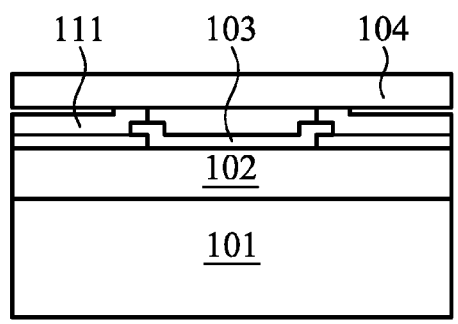
Figure 4C:
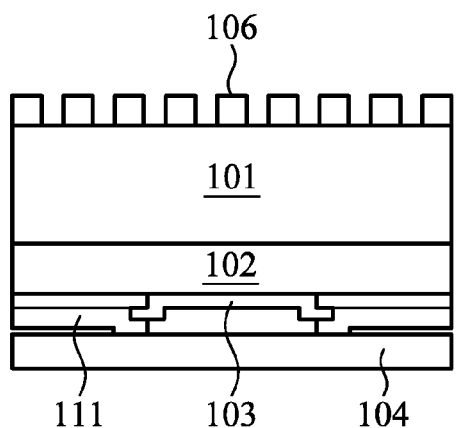
Figure 4D:
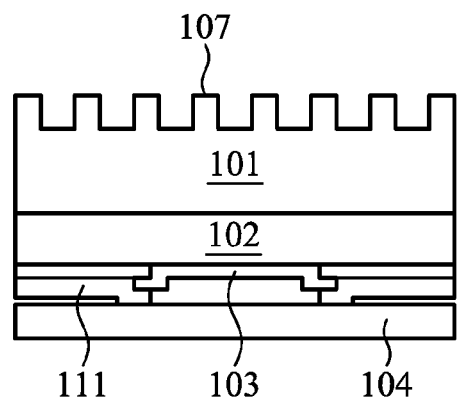

Illustrated in FIG. 4(b), a protection film 104 is formed on top of the passivation layer 111 and the connection pad 103. The substrate structure is then flipped as shown in FIG. 4(c). A plurality of rectangle objects 106 made of photo resist material may be formed on top of a surface of the substrate 101. Etching may be performed on the surface of the substrate 101 to remove areas not covered by the photo resist materials 106, to form a scraggy surface 107 of the substrate as shown in FIG. 4(d). The scraggy surface 107 may comprise a plurality of notches. Details of the scraggy surface may be shown in FIG. 4(g), where a notch 1061 has a height and a width ratio in a range of about 0.4 to 50. For example, the notch of the scraggy surface has a width of about 10 um to 50 um and a height of about 20 um to 500 um.

Figure 4E:
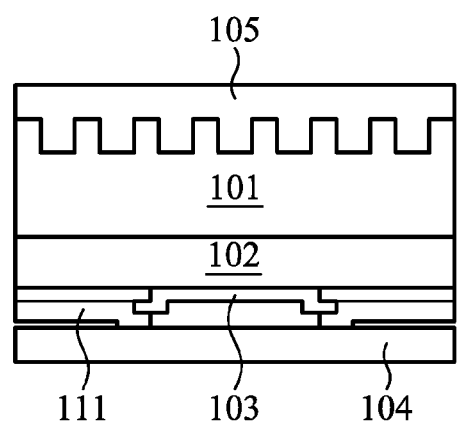

Illustrated in FIG. 4(e), a heat spreader layer 105 is formed in contact with the scraggy surface 107 of the substrate layer 101. The heat spreader layer 105 may comprise Ni, Cu, or other similar materials, which may be coated onto the scraggy surface 107 of the substrate 101. Other structures such as a plurality of TSV may be formed through the substrate layer 101 and the dielectric layer 102 before forming the heat spreader layer 105, which is not shown in FIG. 4(e).

Figure 4F:
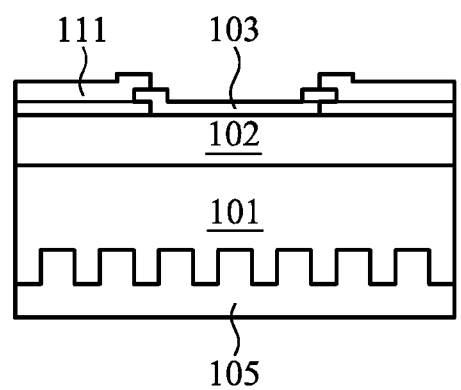
Figure 4G:
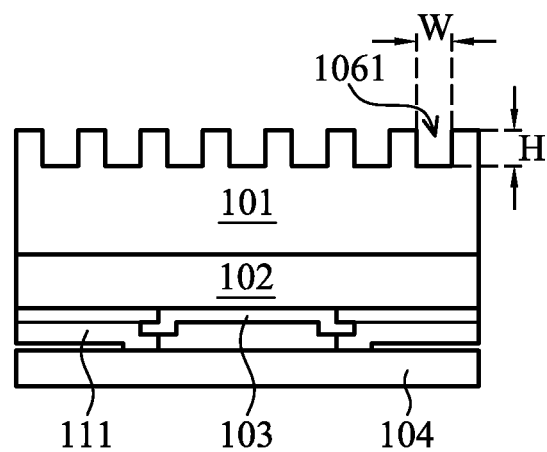

The substrate structure is then flipped again as shown in FIG. 4(f), where the heat spreader layer 105 may be at the bottom of the substrate 101, and the protection film 104 becomes the top. Next, the protection film 104 may be removed as shown in FIG. 4(f).

The method for forming a heat spreader on a substrate is part of the overall packaging method. The packaging method may further proceed to connect a chip to the connection pad 103 by way of a connection device such as a solder ball or a bump, which is not shown in FIGS. 4(a)-4(g). The packaging method may also proceed to connect a plurality of connection devices under the heat spreader layer, and connecting a print circuit board to the plurality of connection devices.

Traditionally, the heat spreader is added after assembly process on the backside of the packaged chip. Such a process is complicated and thermal performance is not desirable. The thickness of the heat spreader is too thick and results in high stress. The disclosed methods and apparatus for forming a heat spreader on a substrate simplify the process of adding a heat spreader, and achieve better heat spreading thermal performance compared to the traditional methods.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A structure for releasing heat for a semi-conductor package, comprising:
    a silicon comprising substrate;
    a dielectric layer on a first surface of the substrate;
    a passivation layer on the dielectric layer;
    a connection pad on the passivation layer; and
    a heat spreader layer in contact with a second surface of the substrate opposite to the first surface, wherein the heat spreader layer covers an entirety of the second surface of the substrate.

2. The structure of claim 1, further comprising a chip connected to the connection pad by way of a connection device.

3. The structure of claim 1, further comprising a plurality of connection devices in contact with the heat spreader layer and connected to a print circuit board.

4. The structure of claim 1, wherein the passivation layer has an opening where the connection pad is located.

5. The structure of claim 1, the substrate further comprising a plurality of through-silicon-vias (TSVs).

6. The structure of claim 5, wherein a TSV of the plurality of TSVs has a height that is equal to a height of the substrate.

7. The structure of claim 1, the heat spreader layer comprising Ni, Cu, or other thermally conductive material.

8. The structure of claim 1, wherein the substrate has a scraggy surface in contact with the heat spreader layer.

9. The structure of claim 8, wherein a notch of the scraggy surface has a width to height ratio in a range of about 2 to about 50.

10. The structure of claim 9, wherein the notch of the scraggy surface has a width of about 10 um to 50 um and a height of about 20 um to 500 um.

11. A structure for a semi-conductor package, comprising:
    a chip connected to a connection pad by way of a bump or a solder ball, wherein the connection pad is located in an opening of a passivation layer;
    a dielectric layer in contact with the passivation layer;
    a silicon substrate with a first surface in contact with the dielectric layer; and
    a heat spreader layer in contact with a second surface of the silicon substrate opposing the first surface, wherein the heat spreader layer covers an entirety of the second surface of the silicon substrate, and wherein at least a portion of the second surface is a scraggy surface.

12. The structure of claim 11, wherein the scraggy surface comprises one or more notches extending into the silicon substrate, and wherein sidewalls of each of the one or more notches comprises is substantially perpendicular to the second surface of the silicon substrate.

13. The structure of claim 12, wherein each of the one or more notches has a width to height ration in a range of about 2 to about 50.

14. The structure of claim 11, further comprising a plurality of connection devices in contact with the heat spreader layer and connected to a print circuit board.

15. A structure for semi-conductor package comprising:
    a substrate having a first surface and a second surface opposite the first surface, wherein at least a portion of the second surface comprises a plurality of notches extending into a silicon material of the substrate;
    a dielectric layer on the first surface of the substrate; and
    a heat spreader on the second surface of the substrate, wherein the heat spreader covers an entire second surface of the substrate and is in contact with each of the plurality of notches extending into the silicon material of the substrate.

16. The structure of claim 15, wherein each of the plurality of notches has a width to height ratio in a range of about 2 to about 50.

17. The structure of claim 15, wherein a surface of the heat spreader opposite the substrate is substantially level.

18. The structure of claim 16, wherein the heat spreader fills each of the plurality of notches.

19. The structure of claim 16, wherein the heat spreader comprises copper or nickel.

20. The structure of claim 16, wherein each of the plurality of notches comprises substantially vertical sidewalls connecting a first lateral portion of the second surface to a second lateral portion of the second surface.

* * * * *